United States Patent
Yu et al.

(10) Patent No.: US 6,573,193 B2
(45) Date of Patent: Jun. 3, 2003

(54) OZONE-ENHANCED OXIDATION FOR HIGH-K DIELECTRIC SEMICONDUCTOR DEVICES

(75) Inventors: Mo-Chiun Yu, Taipei (TW); Yeou-Ming Lin, Chung-Li (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 09/928,377

(22) Filed: Aug. 13, 2001

(65) Prior Publication Data

US 2003/0032303 A1 Feb. 13, 2003

(51) Int. Cl.$^7$ ............................................. H01L 21/31
(52) U.S. Cl. ..................... 438/770; 438/585; 438/595; 438/201
(58) Field of Search ................. 438/770, 585, 438/595, 201

(56) References Cited

U.S. PATENT DOCUMENTS

| | | | | | |
|---|---|---|---|---|---|
| 5,744,374 | A | * | 4/1998 | Moon | 438/287 |
| 6,063,698 | A | * | 5/2000 | Tseng et al. | 438/585 |
| 6,117,351 | A | * | 9/2000 | Li et al. | 216/95 |
| 6,245,682 | B1 | * | 6/2001 | Fu et al. | 438/696 |
| 6,255,122 | B1 | * | 7/2001 | Duncombe et al. | 438/3 |
| 6,320,238 | B1 | * | 11/2001 | Kizilyalli et al. | 257/410 |
| 6,325,017 | B1 | * | 12/2001 | DeBoer et al. | 118/712 |
| 2002/0081826 | A1 | * | 6/2002 | Rotondaro et al. | 438/585 |

\* cited by examiner

*Primary Examiner*—Amir Zarabian
*Assistant Examiner*—Jeff Vockrodt
(74) *Attorney, Agent, or Firm*—Tung & Associates

(57) ABSTRACT

A low temperature ozone-enhanced oxidation process is presented whereby amorphous high dielectric constant film devices are subject to oxidation processes at temperatures whereby crystallization of the amorphous high dielectric constant film is avoided, thereby lowering leakage currents and reducing the required thickness to achieve an equivalent $SiO_2$ thickness (EOT)

18 Claims, 2 Drawing Sheets

OZONE-ENHANCED OXIDATION FOR HIGH-K DIELECTRIC SEMICONDUCTOR DEVICES

FIELD OF THE INVENTION

The present invention relates generally to CMOS device fabrication processes and, more particularly, to a method of manufacturing amorphous high dielectric constant film devices that are subject to oxidation processes at temperatures whereby crystallization of the amorphous high dielectric constant film is avoided.

BACKGROUND OF THE INVENTION

Fabrication of a metal-oxide-semiconductor (MOS) integrated circuit involves numerous processing steps. A gate dielectric, typically formed from silicon dioxide, is formed on a semiconductor substrate which is doped with either n-type or p-type impurities. For each MOS field effect transistor (MOSFET) being formed, a gate conductor is formed over the gate dielectric, and dopant impurities are introduced into the substrate to form a source and drain. A pervasive trend in modern integrated circuit manufacture is to produce transistors having feature sizes as small as possible. Many modern day processes employ features, such as gate conductors and interconnects, which have less than 1.0 micron critical dimension. As feature size decreases, the size of the resulting transistor as well as the interconnect between transistors also decreases. Fabrication of smaller transistors allows more transistors to be placed on a single monolithic substrate, thereby allowing relatively large circuit systems to be incorporated on a single, relatively small die area.

In semiconductor device fabrication, polysilicon and silicon dioxide are commonly used to form gate electrodes and gate dielectrics for metal-oxide-semiconductor (MOS) transistors. As device dimensions have continued to scale down, the thickness of the $SiO_2$ layer has also decreased to maintain the same capacitance between the gate and channel regions. A thickness of the gate oxide layer of less than 2 nanometers (nm) is expected in the future.

In order to achieve increased capacitance, gate oxide thickness has been reduced so much that current oxides are on the order of ten angstroms (1 nm) thick. Unfortunately, thin oxide films may break down when subjected to an electric field, particularly for gate oxides less than 50 Angstroms thick. It is probable that even for a relatively low gate voltage of 3V, electrons can pass through a thin gate oxide by what is known as the quantum mechanical tunneling effect. In this manner, a tunneling current may undesirably form between the semiconductor substrate and the gate conductor, adversely affecting the operability of the device. It is postulated that some of these electrons may become entrapped within the gate oxide by e.g., dangling bonds. As a result, a net negative charge density may form in the gate oxide. As the trapped charge accumulates with time, the threshold voltage $V_T$ may shift from its design specification. Breakdown of the gate oxide may also occur at even lower values of gate voltage, as a result of defects in the gate oxide. Such defects are unfortunately prevalent in relatively thin gate oxides. For example, a thin gate oxide often contains pinholes and/or localized voids due to unevenness at which the oxide grows on a less than perfect silicon lattice.

Because of high direct tunneling currents, $SiO_2$ films thinner than 1.5 nm cannot be used as the gate dielectric in CMOS devices. There are currently intense efforts to replace $SiO_2$ with high-k dielectrics, with $TiO_2$ and $Ta_2O_5$ attracting the greatest attention. However, high temperature post deposition annealing treatments in the presence of oxygen to clean the film by oxidation of impurities and to fill oxygen vacancy defects (form oxide films) in the films (form oxide films) has been found to detrimentally affect high-k dielectric films by leading to crystallization of the film and formation of an interfacial SiO2 layer during the annealing treatment, make achieving an equivalent SiO2 thickness (EOT) of less than 1.5 nm very difficult. As will be appreciated, the high temperature oxygen anneal can cause oxygen to diffuse through the dielectric and form undesired silicon dioxide at the metal oxide/silicon nitride and/or at the silicon nitride/poly interfaces. Silicon dioxide formation at these interfaces will create a low dielectric constant film in series with the high dielectric metal oxide film and therefore reduce the effective capacitance of the film.

One solution to lowering the high tunneling current through thin gate oxide layers (typically SiO2) has been to use alternative high dielectric constant gate oxide materials. Materials with high dielectric constants permit gate dielectric layers to be made thicker, and so alleviate the tunneling current problem. While silicon dioxide (SiO2) has a dielectric constant of approximately 4, other materials have higher k (dielectric constant) values. Silicon nitride ("nitride"), for example, has a k of about 6 to 9 (depending on formation conditions). Much higher dielectric constant values of, for example, 20 or more can be obtained with various transition metal oxides including tantalum oxide ($Ta_2O5$), barium strontium titanate ("BST"), and lead zirconate titanate ("PZT"). Using a high-k material for a gate dielectric would allow a high capacitance to be achieved even with a relatively thick dielectric. For example, a nitride gate dielectric having a thickness of 100 angstroms is substantially electrically equivalent to a silicon oxide gate dielectric having a thickness of about 50 angstroms. For even higher-k dielectrics, even thicker gate dielectrics could be formed while maintaining capacitance values higher than are possible with even very thin oxide layers. In this way, the reliability problems associated with very thin dielectric layers may be avoided while transistor performance is increased. These high-k dielectric films (high dielectric constant films) are defined herein as having a high dielectric constant relative to silicon dioxide. Typically, silicon dioxide has a dielectric constant of approximately 3.9, while high dielectric constant films have dielectric constants in the range of about 20 to 40.

Another problem associated with the above-mentioned high-k dielectrics is that, as mentioned, they may develop a crystalline structure under normal preparation conditions leading to a roughened film surface. Surface roughness causes non-uniform electrical fields in the channel region adjacent the dielectric film. Such films are not suitable for the gate dielectrics of MOSFET devices.

Despite their advantages, high-k materials pose IC fabrication challenges. For example, high-k material is relatively difficult to etch, unlike a conventional thermal oxide. Chemical etchants used with high-k materials may cause increased damage to associated oxide materials making high temperature rapid thermal oxidation processes necessary to repair such damage while leading to the undesirable effect of crystallization of an amorphous high-k dielectric film.

As a result, it would be advantageous if high-k dielectric films could be formed with reduced surface roughness, crystallinity, and electrical leakage. It would be advantageous if these non-crystalline high dielectric constant materials could be used in gate dielectrics and storage capacitors of integrated circuits. Possible solutions are to improve the thermal stability of the high-k dielectric films thereby avoiding film crystallization, or to provide processes whereby lower process temperatures (lower thermal budgets) are achieved. The thermal budget of a process is defined as the integral of device temperature T (t) over a fixed period of time.

High temperature processes that may be typically included in CMOS device manufacture include LDD (lightly doped drain) processes carried out at temperatures greater or equal to 900° C. and S/D (source/drain) activation carried out at greater or equal to 1000° C. More importantly, other processes may degrade high-k dielectric film properties such as poly-gate oxidation carried out at temperatures of about 1000° C.

Therefore it would be advantageous to develop a low temperature oxidation process whereby high-k dielectric film properties are not degraded. It is therefore an object of the invention to provide a low temperature oxidation process with a low thermal budget to carry out oxidations, thereby solving the problem of high-k dielectric film degradation in small structure (e.g., 0.10 micron) devices.

SUMMARY OF THE INVENTION

To achieve the foregoing and other objects, and in accordance with the purposes of the present invention, as embodied and broadly described herein, the present invention provides a method for carrying out carrying out a low temperature ozone enhanced oxidation process of a high dielectric constant film.

In one embodiment, the present invention provides a low temperature oxidation process of a high dielectric constant film including: providing a semiconductor device comprising an amorphous high dielectric constant film deposited on a substrate; heating the amorphous high dielectric constant film in the presence of an ozone containing ambient to a temperature below which the amorphous high dielectric constant film begins to crystallize; and, forming an oxide film over the semiconductor device.

In a related embodiment, the present invention includes heating the amorphous high dielectric constant film over a range of temperatures from about 450° C. to about 550° C.

In another related embodiment, the ozone containing ambient may include a mixture of at least ozone and oxygen and the ozone concentration may be varied to alter the rate of the oxide film growth over the semiconductor device. In particular, changing the ozone concentration will cause the growth rate of the oxide film to vary in direct proportion thereto.

In yet another related embodiment, the temperature of the ambient may be varied to alter the growth rate of the oxide film over the semiconductor device. In particular, changing the temperature will cause the growth rate of the oxide film to vary in direct proportion thereto.

In yet another related embodiment, the low temperature ozone enhanced oxidation process follows a wet chemical etching process where the chemicals may include the use of HF and hot $H_3PO_4$, and where the low temperature ozone enhanced oxidation replaces a relatively higher temperature rapid thermal oxidation process where crystallization of the amorphous high dielectric constant film may occur. In this embodiment, the low temperature ozone enhanced oxidation process is carried out at a temperature and a period of time such that an etching damage is removed and crystallization of the amorphous high dielectric constant film is avoided.

In yet another related embodiment, the method of the present invention replaces a process of the prior art including a high temperature poly-gate oxidation.

In yet another related embodiment, the method of the present invention is carried out at a temperature and a period of time such that formation of an interfacial oxide layer is avoided.

In yet another embodiment, according to the present invention, includes a method for carrying out a low temperature enhanced ozone oxidation process on a front end gate dielectric device including: providing a front end gate dielectric device comprising an amorphous high dielectric constant film; and, heating the amorphous high dielectric constant film in the presence of an ozone containing ambient to a temperature for a period of time such that crystallization of the amorphous high dielectric constant is avoided.

DETAILED DESCRIPTION OF THE PREFERRED EMBODIMENTS

Frequently, following deposition of a high-k dielectric (amorphous film) in the manufacture of a high-k gate dielectric, temperature post-deposition annealing treatments in the presence of oxygen is desirable to clean the film by oxidation of residual impurities and to fill oxygen vacancy defects in the films (form an oxide film).

This process, however, has been found to detrimentally affect amorphous high-k dielectric films by leading to crystallization of the film and formation of an interfacial SiO2 layer during the annealing treatment (due to oxygen transport through high-k dielectric films), leading to high leakage currents and requiring increased thickness to achieve an equivalent $SiO_2$ thickness (EOT).

In a process according to the prior art a rapid thermal oxidation (RTO) step is carried out in a poly-gate oxidation process to form about a 20 Angstrom thick oxide film at about 1000° C. In the process according to the present invention, an $O_3$ (ozone) enhanced low temperature thermal oxidation is carried out within a temperature range of about 450 to about 550° C., to form an oxide film. In addition, the process according to the present invention may be carried out over a range of pressures from about 1 to 260 torr. Ozone concentrations may be varied from about 1 percent up to about 100 percent.

Figure 1:
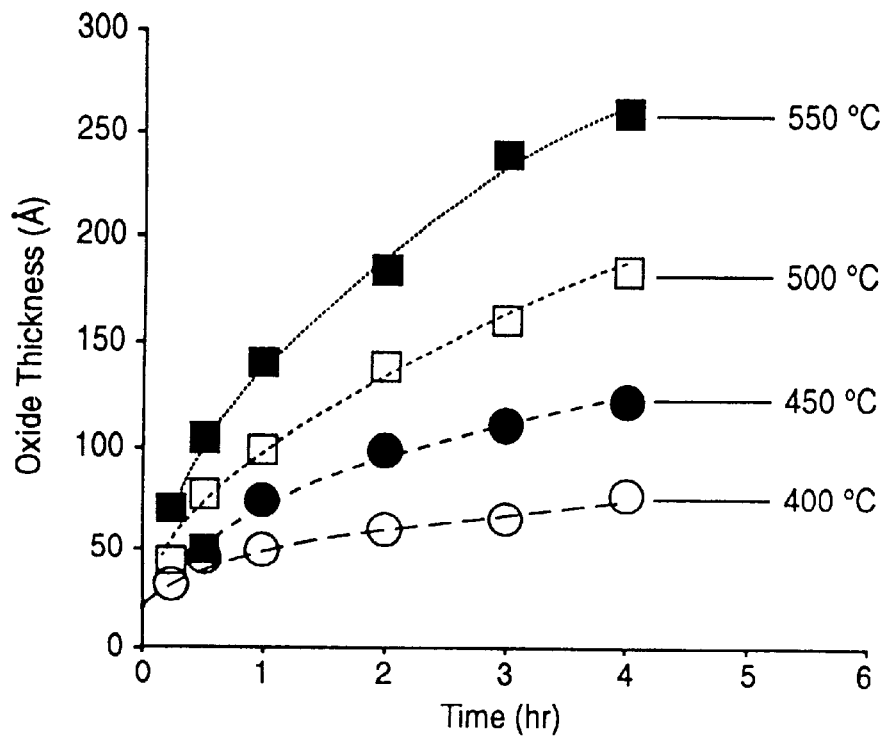
FIG. 1 is a graph that shows the oxide growth rate versus time at different ozone enhanced oxidation temperatures.

According to the process of the present invention it will be appreciated that rates of growth of an oxide layer in a poly-oxidation process may be varied by altering the temperature and/or the $O_3$ concentration in an $O_2/O_3$ mixture. As shown in FIG. 1, the rate of growth of oxide thickness may be altered by changing the temperature at a fixed $O_3$ concentration. It can be seen in FIG. 1 that the rate of growth of the oxide film varies directly with a change in temperature.

Likewise, the rate of growth of the oxide film varies directly with a change in ozone concentration. An artist of ordinary skill will appreciate that temperature and $O_3$ concentration may be adjusted to achieve various combinations of temperature and $O_3$ concentration to give a desired rate of oxide film growth.

Figure 2:
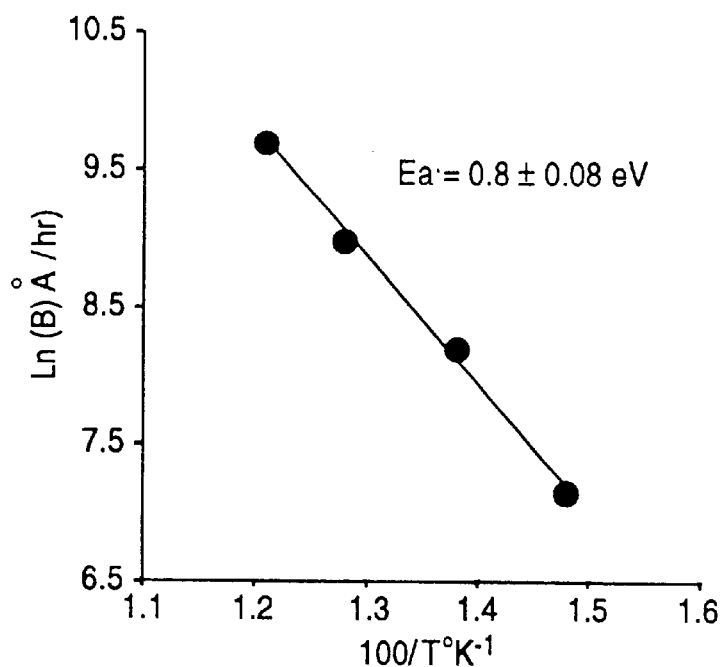
FIG. 2 is a graph of the natural logarithm of the oxide growth rate versus inverse temperature representing an apparent activation energy of the rate of growth (B) of the oxide layer.

As shown in FIG. 2, it is believed the production of an activated oxygen species from $O_3$ (Ozone) has a lower activation energy (0.8 eV) which is represented by the apparent activation energy of the rate of growth (B) of the oxide layer according to an ozone enhanced oxidation. As a result, according to the present invention, a lower temperature (lower thermal budget) ozone-enhanced oxidation process can be used to replace higher temperature processes, thereby eliminating crystallization of the high-k dielectric film, thus lowering leakage currents and reducing the required thickness to achieve an equivalent $SiO_2$ thickness (EOT).

Figure 3A:
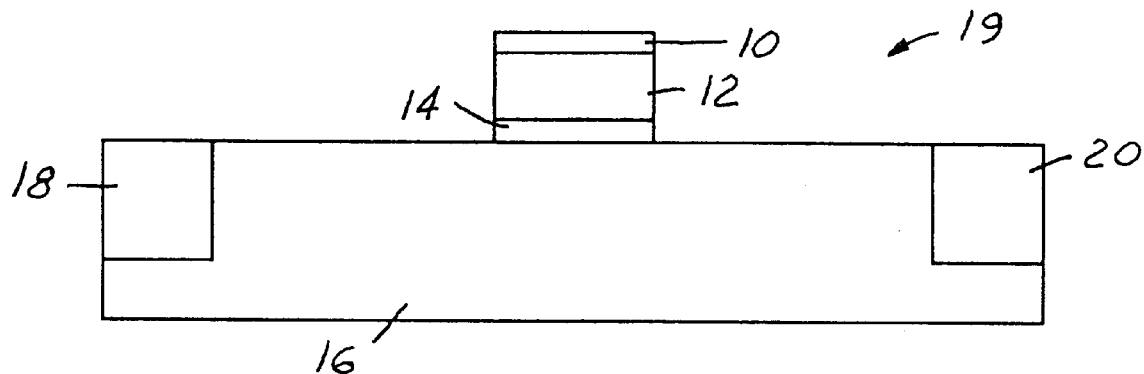
FIG. 3A is a cross-sectional view of a typical gate oxide device showing typical parts of the device including a hard mask.
Figure 3B:
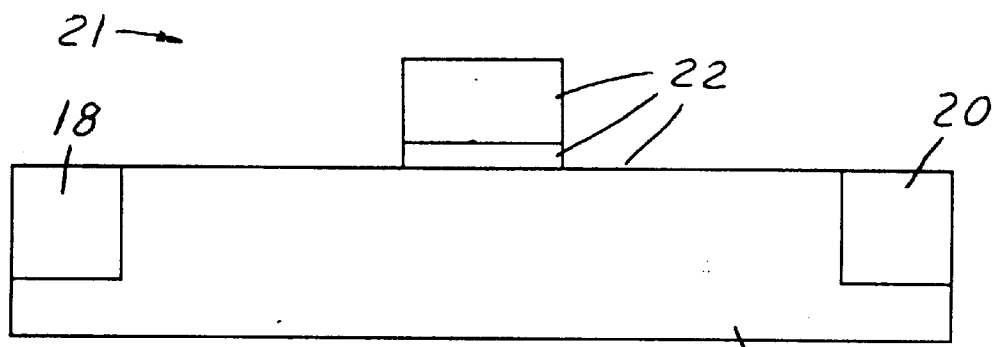
FIG. 3B is a cross-sectional view of a typical gate oxide device showing damaged areas according to a wet chemical etch.

In another aspect of the invention, a low temperature ozone enhanced oxidation process can be used to remove etching damage from a wet chemical etching (stripping) process. FIG. 3A shows a typical gate oxide device (19). As shown, the device includes a high-k- gate dielectric (14) a polysilicon gate (12), source/drain silicon (16), a source area e.g., (18) and a drain area (20). As shown in FIG. 3A as part of the gate patterning process, the SiON (silicon oxynitride)+PEOX hard mask (10) for photo application remains which is removed by using a wet chemical stripping process whereby HF (hydrogen fluoride)and hot $H_3PO_4$ (phosphoric acid) are used. FIG. 3B shows the same gate oxide device (21) as FIG. 3A, but with the hard mask (10) removed. This wet chemical process can damage the S/D. (source/drain) silicon (16) and/or the poly-Silicon gate (12) as well as the high-k gate dielectric (14). Examples of where damaged areas are created by the wet chemical process are indicated at (22) in FIG. 3B. Following this process according to the prior art, a high temperature rapid thermal oxidation process (RTO) is carried out. The rapid thermal oxidation (RTO) process is carried out to deposit (grow) a silicon oxide film on the order of 20 Angstroms. This procedure removes damage caused by the wet chemical etching process.

Figure 3C:
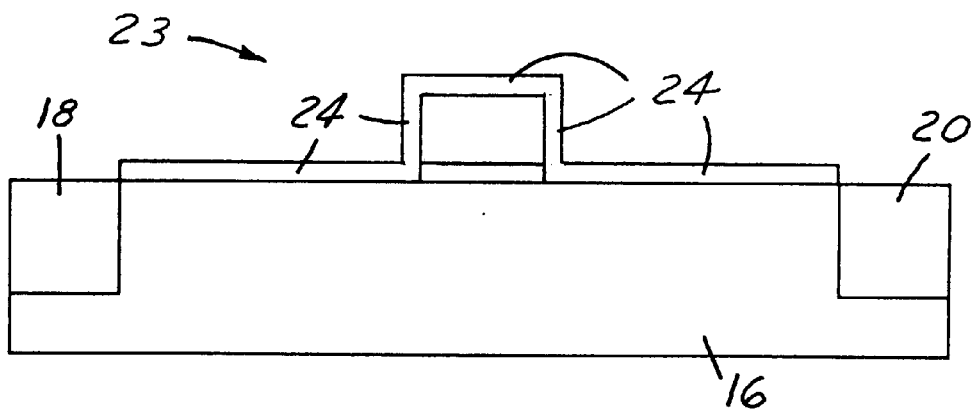
FIG. 3C is a cross-sectional view of a typical gate oxide device with an oxide layer formed removing damaged areas according to the low temperature ozone enhanced oxidation process of present invention.

According to the present invention, as shown in FIG. 3C, a low temperature ozone enhanced oxidation process replaces the RTO of the prior art. The ozone-enhanced oxidation is carried out at temperatures in the range of about 450 to about 550° C. This low temperature oxidation process can effectively remove damage caused by previous etching processes (wet or dry), and additionally prevents the high-k material from being crystallized. In FIG. 3C the gate oxide device (23) is shown with for example a 20 Angstrom oxide layer (24) grown according to the low temperature ozone enhanced oxidation of the present invention. As a result, the benefits realized according to the present invention include lowering leakage currents and reducing the required thickness to achieve an equivalent SiO2 thickness (EOT), as well as lowering threshold voltage variation.

While the embodiments illustrated in the figures and as described above are presently preferred, it should be understood that these embodiments are offered by way of example only. Other embodiments may include; for example, different semiconductor devices that may use high dielectric constant films and that will benefit from a low temperature oxidation process whereby crystallinity is avoided. The invention is not limited to a particular embodiment, but extends to various modifications, combinations, and permutations that nevertheless fall within the scope of the appended claims.

What is claimed is:

1. A method for carrying out a low temperature oxidation process on a polysilicon gate including a high dielectric constant film to remove etching damage comprising the steps of:

providing a polysilicon gate comprising a high-K amorphous gate dielectric film deposited on a substrate; and, heating the polysilicon gate in the presence of an ambient comprising oxygen and ozone to a temperature below a crystallization temperature of the high-K amorphous gate dielectric film to form a silicon oxide film over the polysilicon gate.

2. The method of claim 1, wherein the step of heating the polysilicon gate is carried out within a range of temperature from about 450 degrees Centigrade to about 550 degrees Centigrade.

3. The method of claim 1, wherein the dielectric constant of the high-K amorphous gate dielectric film has a dielectric constant from about 20 to about 40.

4. The method of claim 1, wherein a concentration of ozone is selected to achieve a desired growth rate of the silicon oxide film.

5. The method of claim 1, wherein the temperature of the ambient is selected to achieve a desired growth rate of the silicon oxide film.

6. The method of claim 1, wherein the temperature of the polysilicon gate is selected between a range of about 450 degrees Centigrade to about 550 degrees Centigrade to achieve a desired growth rate of the silicon oxide film.

7. The method of claim 1, wherein a thickness of the silicon oxide film is formed having a thickness of about 15 Angstroms to about 50 Angstroms.

8. The method of claim 1, wherein the step of heating the polysilicon gate follows a wet chemical etching process to remove a hardmask overlying the polysilicon gate.

9. The method of claim 8, wherein the wet chemical etching process comprises the use of at least one of HF and $H_3PO_4$.

10. The method of claim 1, wherein the steps of heating the polysilicon gate and forming a silicon oxide film are carried out at a temperature for a period of time such that crystallization of the high-K amorphous gate dielectric film is avoided.

11. The method of claim 10, wherein the steps of heating the polysilicon gate and forming a silicon oxide film are carried out at a temperature for a period of time such that formation of an interfacial oxide layer is avoided.

12. The method of claim 8, wherein the steps of heating the polysilicon gate and forming a silicon oxide film are carried out at a temperature and a period of time such that an etching damage from the wet chemical etching process is removed and crystallization of the high-K amorphous gate dielectric film is avoided.

13. The method of claim 1, wherein the step of wet etching comprises the use of at least one of HF and $H_3PO_4$.

14. A method for removing wet etching damage in a polysilicon gate structure while avoiding crystallization of an amorphous high-k gate dielectric and formation of an interfacial oxide layer comprising the steps of:

providing a semiconductor wafer having a process surface comprising a polysilicon gate structure including an underlying high-K amorphous gate dielectric film;

wet etching the gate structure to remove a nitride hardmask overlying the polysilicon gate structure; and, heating the process surface in an ambient comprising ozone and oxygen at a temperature lower than a crystallization temperature of the amorphous gate dielectric to grow a silicon oxide film over the process surface to remove wet etching damage at the process surface from the step of wet etching while avoiding crystallization of the amorphous gate dielectric film and formation of an interfacial oxide layer.

15. The method of claim 14, wherein the step of heating comprises heating the process surface within a range of about 450 degrees Centigrade to about 550 degrees Centigrade.

16. The method of claim 14, wherein the dielectric constant of the high-K amorphous gate dielectric film has a dielectric constant from about 20 to about 40.

17. The method to claim 14, wherein a concentration of ozone in the ambient is selected to achieve a desired growth rate of the silicon oxide film.

18. The method of claim 14, wherein a thickness of the silicon oxide film is formed having a thickness of about 15 Angstroms to about 50 Angstroms.

* * * * *